United States Patent
Yamaguchi et al.

(10) Patent No.: US 8,193,806 B2
(45) Date of Patent: Jun. 5, 2012

(54) OBJECT DETECTING APPARATUS

(75) Inventors: Shoji Yamaguchi, Kanagawa (JP); Mario Fuse, Kanagawa (JP); Tsukasa Matsuda, Kanagawa (JP); Kunihiro Takahashi, Kanagawa (JP); Hiroyoshi Inoue, Kanagawa (JP); Eizo Kurihara, Kanagawa (JP); Seigo Makida, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 442 days.

(21) Appl. No.: 12/557,923

(22) Filed: Sep. 11, 2009

(65) Prior Publication Data
US 2010/0201355 A1    Aug. 12, 2010

(30) Foreign Application Priority Data
Feb. 6, 2009  (JP) .................................. 2009-025558

(51) Int. Cl.
*G01N 27/72* (2006.01)
(52) U.S. Cl. .......... 324/228; 324/166; 324/243; 340/551
(58) Field of Classification Search .................. None
See application file for complete search history.

(56) References Cited

U.S. PATENT DOCUMENTS
4,027,303 A * 5/1977 Neuwirth et al. .............. 340/552
2007/0222437 A1* 9/2007 Haase ........................... 324/228

FOREIGN PATENT DOCUMENTS
JP      A-2003-182847    7/2003
JP      A-2008-20346     1/2008

* cited by examiner

*Primary Examiner* — Huy Q Phan
*Assistant Examiner* — Temilade S Rhodes-Vivour
(74) *Attorney, Agent, or Firm* — Oliff & Berridge, PLC

(57) ABSTRACT

An object detecting apparatus that detects an object including a magnetic body including: a detection signal acquiring unit that acquires a detection signal based on a magnetic signal; a disturbance source detection signal storage unit that stores a detection signal of a disturbance source that generates a disturbance component with respect to the detection signal; a determining unit that determines whether the detection signal acquired by the detection signal acquiring unit contains the disturbance component; an amplitude correction unit that corrects an amplitude of the disturbance source detection signal and generates an amplitude-corrected disturbance source detection signal; a disturbance component suppression unit that generates a determination signal by suppressing the disturbance component contained in the detection signal; and an object determination unit that determines whether the object is the object to be detected based on the determination signal.

13 Claims, 7 Drawing Sheets

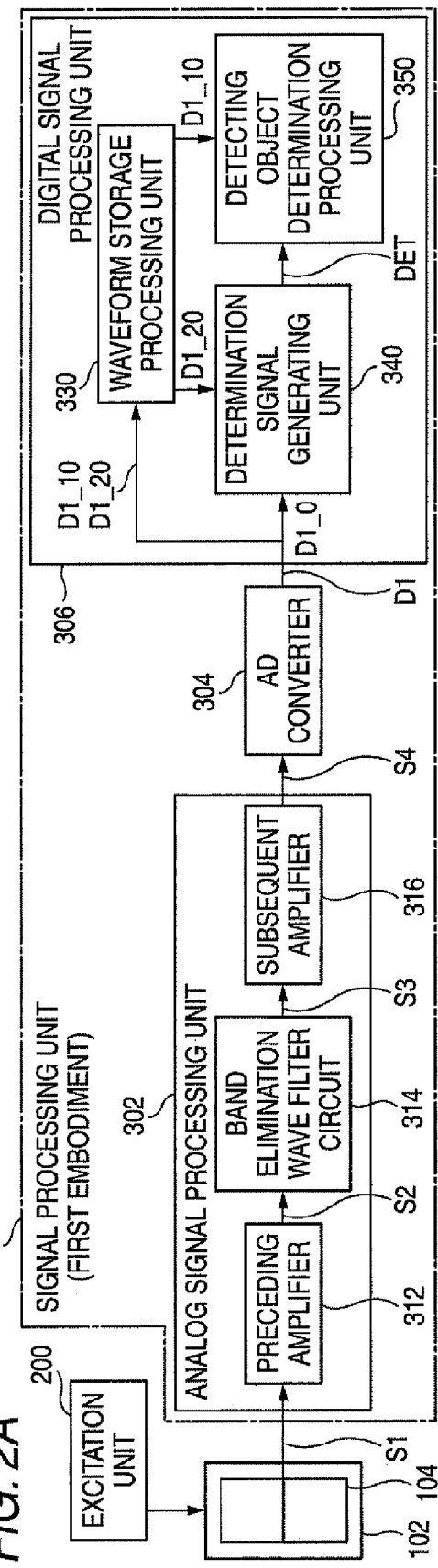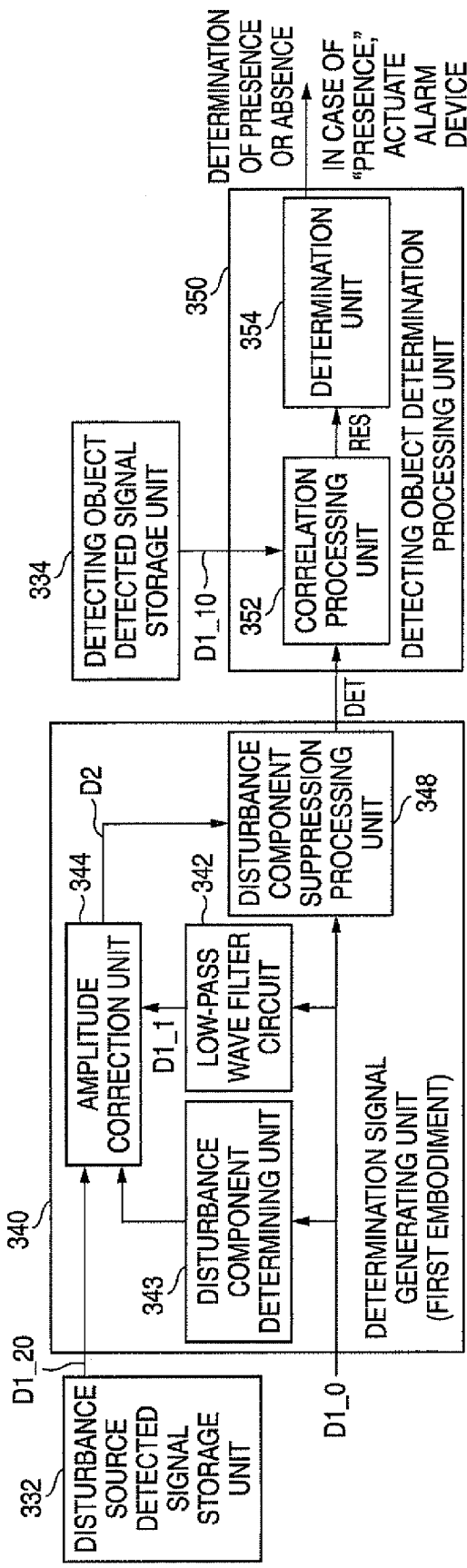
FIG. 2A
FIG. 2B

FIG. 4
< DETECTING PROCESSING: FIRST EMBODIMENT >

(1): WAVEFORM OF ONLY DISTURBANCE SOURCE COLLECTED IN ADVANCE
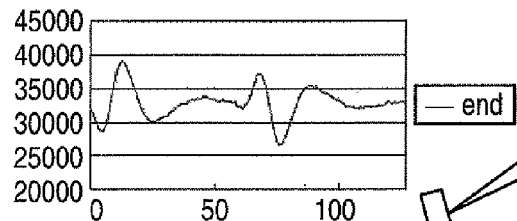

TO CORRESPOND TO AMPLITUDE OF WAVEFORM OF DISTURBANCE SOURCE OF WAVEFORM OF "RECORDING PAPER + DISTURBANCE SOURCE"

(2): AMPLITUDE-CORRECTED DISTURBANCE OUTPUT SIGNAL WAVEFORM
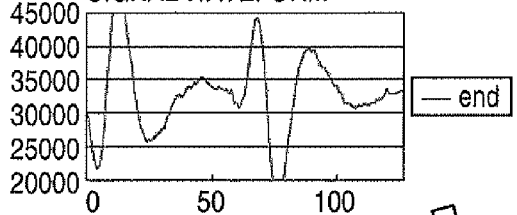

(3): WAVEFORM OF "RECORDING PAPER + DISTURBANCE SOURCE"
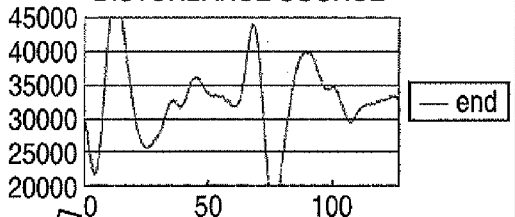

(4): WAVEFORM IN WHICH AMPLITUDE-CORRECTED DISTURBANCE OUTPUT SIGNAL WAVEFORM IS SUBTRACTED FROM WAVEFORM OF "RECORDING PAPER + DISTURBANCE SOURCE" = DETERMINATION SIGNAL WAVEFORM
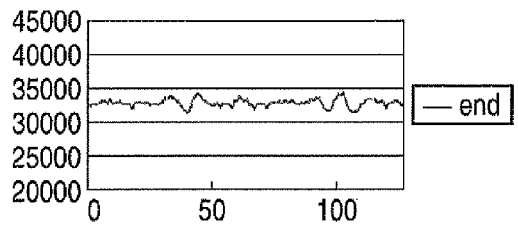

(5): WAVEFORM OF ONLY RECORDING PAPER (WITH MAGNETIC WIRING) COLLECTED IN ADVANCE
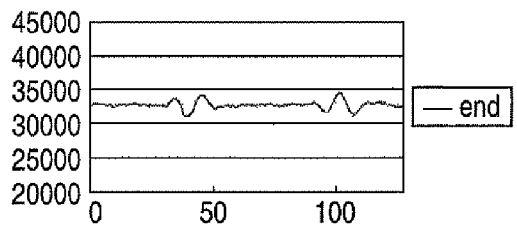

(6): COMPARISON OF (5): WAVEFORM OF ONLY RECORDING PAPER AND (4): DETERMINATION SIGNAL WAVEFORM
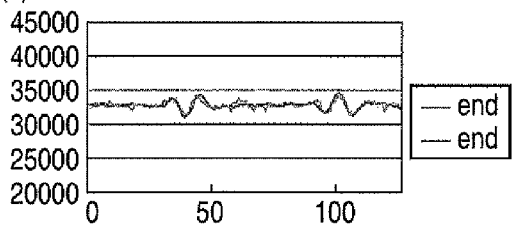

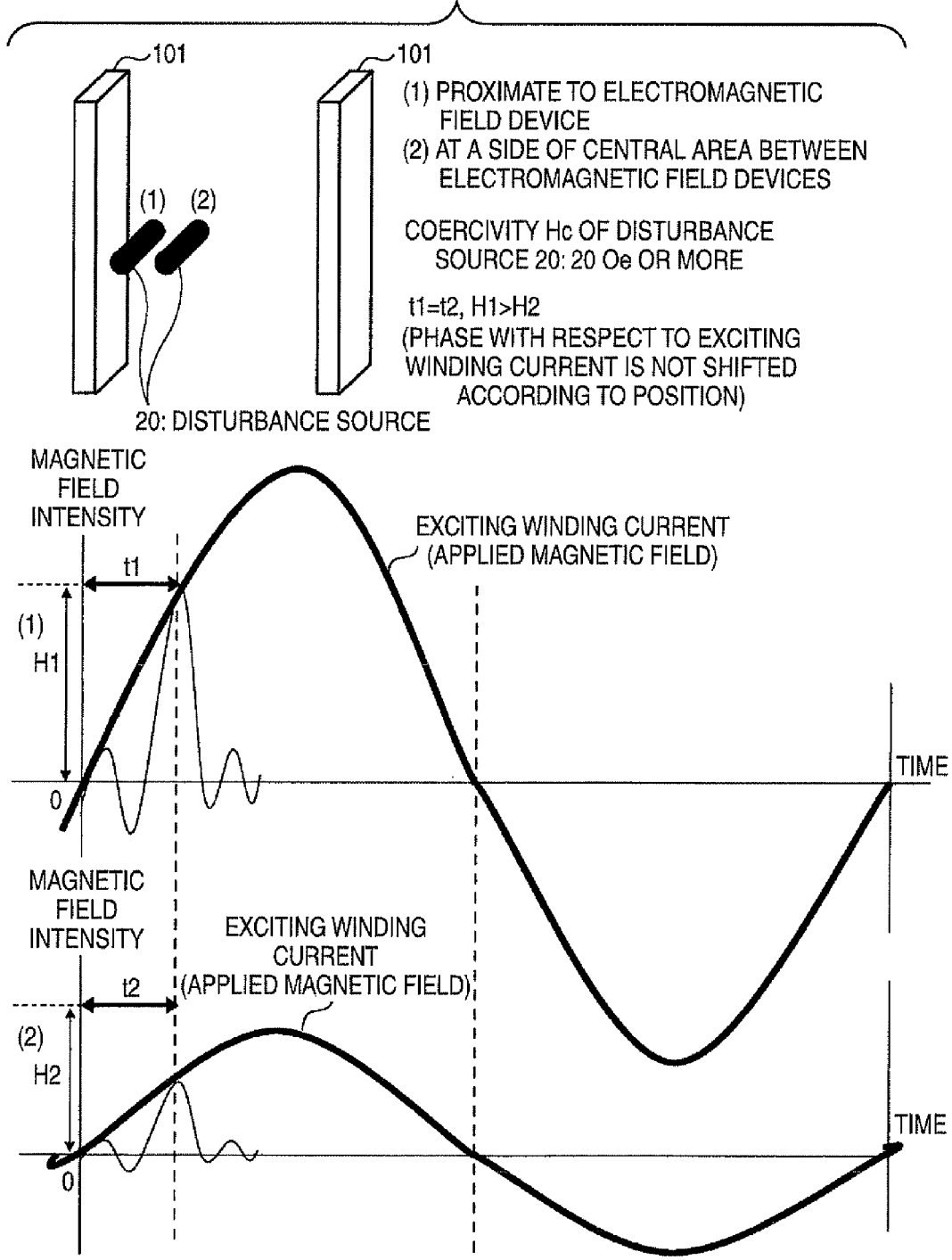

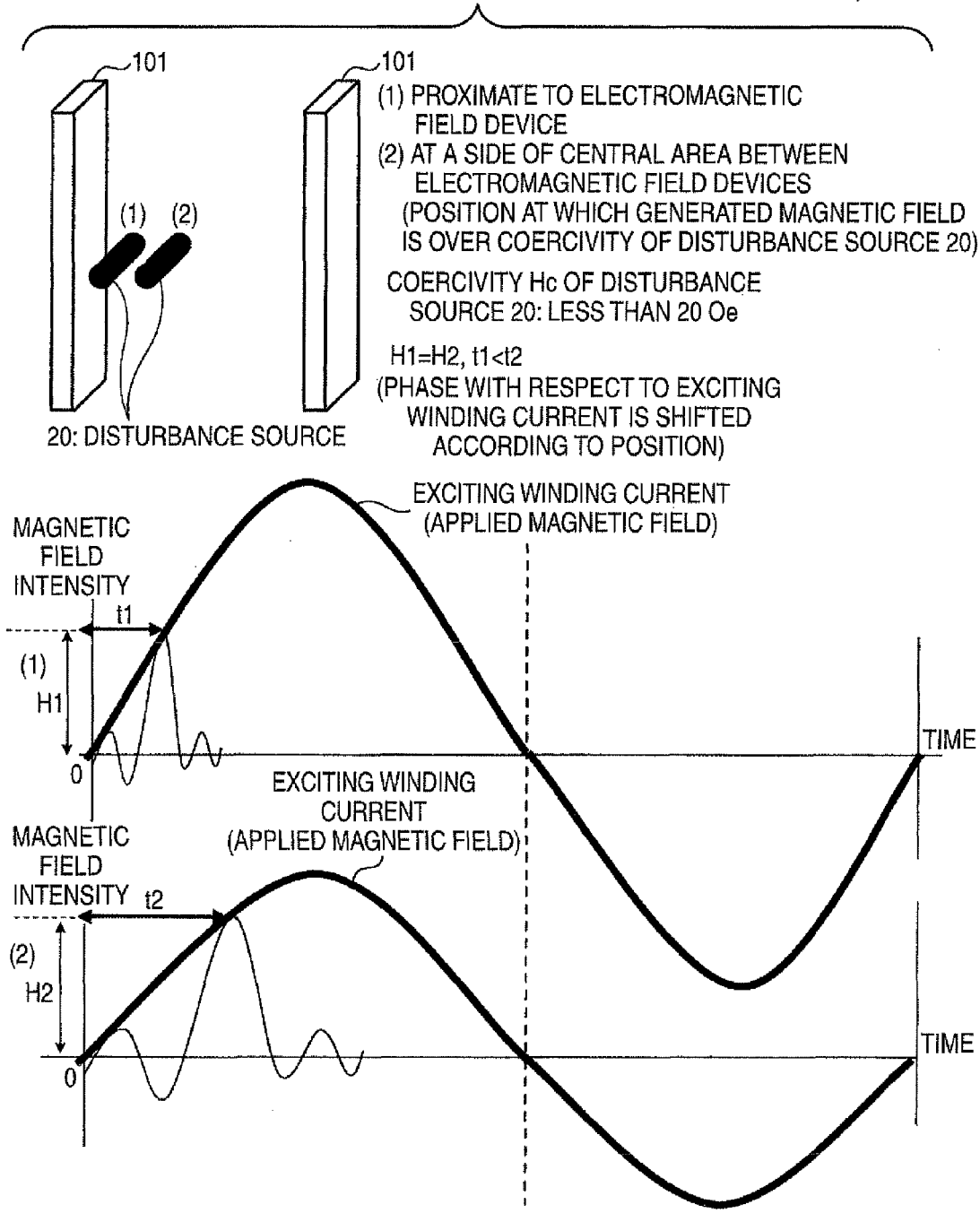

OBJECT DETECTING APPARATUS

CROSS-REFERENCE TO RELATED APPLICATIONS

This application is based on and claims priority under 35 U.S.C. 119 from Japanese Patent Application No. 2009-025558 filed Feb. 6, 2009.

BACKGROUND

1. Technical Field

The present invention relates to an object detecting apparatus.

2. Related Art

There have been proposed mechanisms for the purpose of enhancing security such as prevention of leakage of classified information, personal information, and the like, prevention of forgery of valuable securities, or prevention of theft of articles (refer to Japanese Published Unexamined Patent Application No. 2003-182847, and No. 2008-020346).

For example, a magnetic wire is provided to an object serving as an object to be detected (called a detecting object) such as a recording paper or the like. Exciting coils and detecting coils are provided to a gate for managing a passage of the object. When the detecting object goes into the gate, an alternating magnetic field generated by the exciting coils provided to the gate causes magnetization reversal in the magnetic wire provided to the detecting object. A rapid magnetic pulse according to the magnetization reversal is detected by the detecting coils of the gate, to detect the object going into the gate.

In the mechanism described in Japanese Published Unexamined Patent Application No. 2003-182847, a magnetic marker provided to a detecting object includes a magnetic wire causing rapid magnetization reversal when an alternating magnetic field is applied thereto, and an ON/OFF control element that generates a bias magnetic field capable of inhibiting magnetization reversal. Magnetic markers are turned into an on-state when detecting objects are received by a store, and a magnetic marker of a paid detecting object is turned into an off-state. When magnetization reversal of a magnetic marker is detected when a detecting object passes through an exit gate, it is determined that the detecting object is an unpaid detecting object.

In the mechanism described in Japanese Published Unexamined Patent Application No. 2008-020346, waveforms (called disturbance waveforms) of envisioned disturbance sources (noise sources) such as notebook-type personal computers (called notebook personal computers) or steel cans composed of metal materials, are stored in advance. Then, by carrying out an arithmetic operation of a detection signal waveform and the stored respective disturbance waveforms, even when a person passing through the gate having a detecting object to which a magnetic wire is provided and a disturbance source together goes into the gate, it is possible with high precision to detect a signal from the magnetic wire more than the mechanism in Japanese Published Unexamined Patent Application No. 2003-182847.

SUMMARY

According to an aspect of the present invention, there is provided an object detecting apparatus that detects an object including a magnetic body, the object detecting apparatus including:

a detection signal acquiring unit that acquires a detection signal including a signal indicative of an object based on a magnetic signal generated in a magnetic body receiving an alternating magnetic field;

a disturbance source detection signal storage unit that stores, in advance, a detection signal of a disturbance source being preassigned as a reference, as a reference disturbance source detection signal, wherein the disturbance source includes a magnetic body that generates a disturbance component with respect to the detected signal including the signal indicative of the object, and the reference disturbance source detection signal has been acquired by the detection signal acquiring unit by exposing the disturbance source to the alternating magnetic field;

a determining unit that determines whether or not the detection signal acquired by the detection signal acquiring unit contains the disturbance component;

an amplitude correction unit that, when the determining unit determines that the disturbance component is contained in the detection signal, corrects an amplitude of the reference disturbance source detection signal read out of the disturbance source detection signal storage unit, so as to correspond to an amplitude of the detection signal acquired by the detection signal acquiring unit, to generate an amplitude-corrected disturbance source detection signal;

a disturbance component suppression unit that generates a determination signal by suppressing the disturbance component contained in the detection signal based on the detection signal acquired by the detection signal acquiring unit and amplitude-corrected disturbance source detection signal generated by the amplitude correction unit; and an object determination unit that determines whether or not the object receiving the alternating magnetic field is the object to be detected based on the determination signal generated by the disturbance component suppression unit.

BRIEF DESCRIPTION OF THE DRAWINGS

Exemplary embodiments of the present invention will be described in detail based on the following figures, wherein:

FIGS. 2A and 2B are diagrams for explanation of a signal processing unit of a first embodiment;

FIG. 4 is diagram for explanation of object detecting processing of the first embodiment;

FIG. 6 is diagram for explanation of object detecting processing of the second embodiment (a case in which coercivity of a disturbance source is greater than a maximum excitation magnetic field); and FIG. 7 is diagram for explanation of object detecting processing of the second embodiment (a case in which coercivity of a disturbance source is less than a maximum excitation magnetic field).

DETAILED DESCRIPTION

Figure 1A:
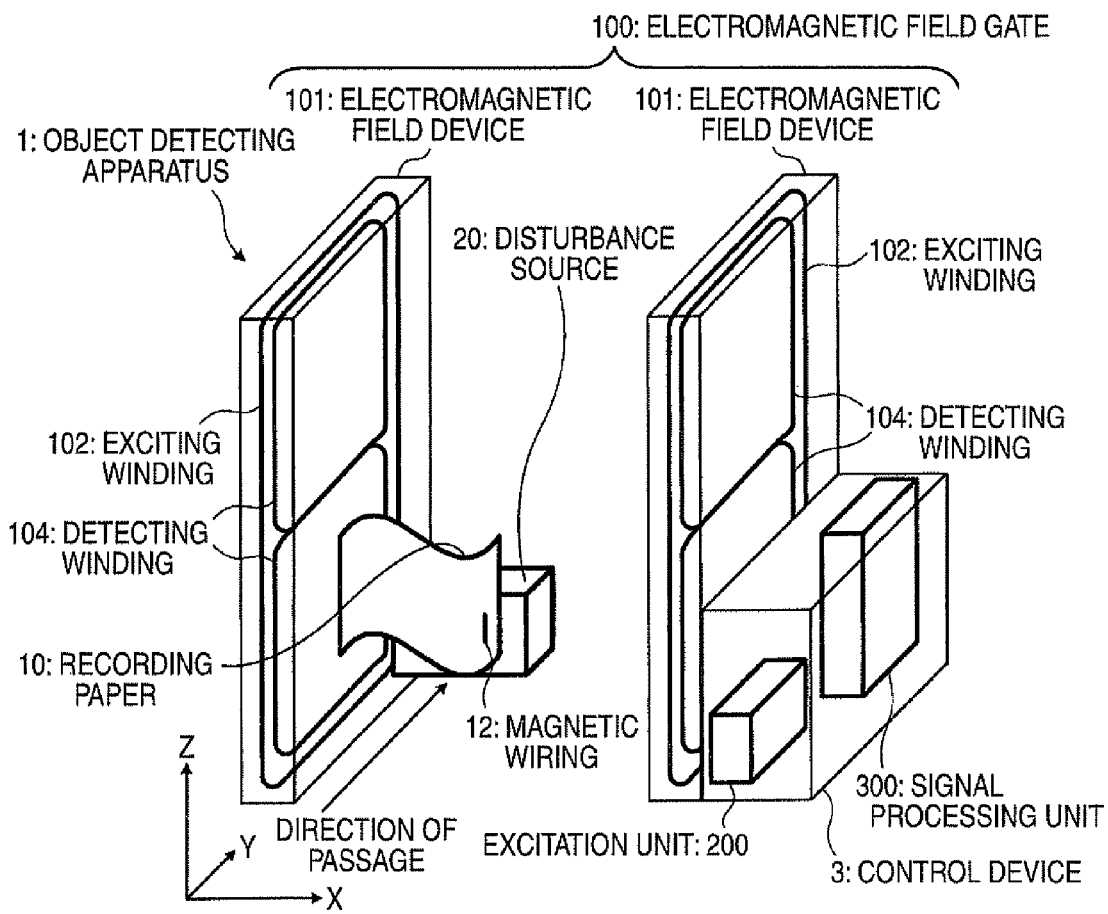
FIGS. 1A and 1B are diagrams showing a general outline of an object detecting apparatus.

Hereinafter, embodiments of the present invention will be described in detail with reference to the drawings. When the respective functional elements are distinguished for each embodiment, the respective functional elements are described with reference marks in English uppercase letters such as A, B, and . . . , and when the respective functional elements are described without particular distinction, those are described so as to omit the reference marks. This is the same in the drawings.

<General Outline>

[Apparatus Configuration]

FIGS. 1A and B are diagrams showing a general outline of an object detecting apparatus. An object detecting apparatus 1 is to achieve a function of preventing fraudulent taking out of a recording paper 10 (print sheet) as an example of a detecting object to which a magnetic body is added. In detail, the object detecting apparatus 1 includes an electromagnetic field gate 100 (gate) composed of a pair of electromagnetic field devices 101 (antenna devices) as an example of an electromagnetic field generation detecting unit, an excitation unit 200 (alternating magnetic field generating unit) that generates an electromagnetic field (alternating magnetic field) in a detecting area in which the electromagnetic field devices 101 of the electromagnetic field gate 100 face each other, and a signal processing unit 300 that executes signal processing on the basis of a detection signal detected between the electromagnetic field devices 101. The excitation unit 200 and the signal processing unit 300 are housed in a control device 3 provided integrally with one of the electromagnetic field devices 101.

The pair of electromagnetic field devices 101 are disposed so as to face each other, which forms a gate having a detecting area between the electromagnetic field devices 101. Note that, in the drawing, an axis along the direction in which the electromagnetic field devices 101 face each other is the X-axis, the direction of passage of the recording paper 10 is the Y-axis, and the direction of height of the electromagnetic field devices 101 is the Z-axis.

For example, a person with the recording paper 10 or a disturbance source 20 passes through the gate of the electromagnetic field gate 100 (between the pair of electromagnetic field devices 101). A wire-formed magnetic wiring 12 (magnetic fiber) as an example of a magnetic body is added to the recording paper 10. The recording paper 10 to which the magnetic wiring 12 is added will be hereinafter referred to as "the recording paper 10 (with the magnetic wiring 12) " in some cases.

The electromagnetic field devices 101 detect a signal from the magnetic wiring 12 when the recording paper 10 (with the magnetic wiring 12) passes through the electromagnetic field gate 100, to deliver the detection signal to the signal processing unit 300. The signal processing unit 300 executes processing on the detection signal to determine the presence or absence of passage of the recording paper 10 (with the magnetic wiring 12) through the gate. That is, the object detecting apparatus 1 prohibits fraudulent taking out of the recording paper 10 (with the magnetic wiring 12) by detecting the recording paper 10 (with the magnetic wiring 12) between the pair of electromagnetic field devices 101.

The magnetic wiring 12 is formed of, for example, soft magnetic material such as a Fe—Co base amorphous material, iron base, Fe—Co—Ni base, or Fe—Si—Al alloy, sendust, a nickel-iron base (Ni—Fe), or permalloy, Ni—Mo—Cu—Fe, and its coercivity is less than 1 Oe, and the magnetic wiring 12 has a large Barkhausen effect. As a technique of adding the magnetic wiring 12 to the recording paper 10, for example, the magnetic wiring 12 may be provided so as to be watermarked into the recording paper 10, or may be bonded onto the recording paper 10 with an adhesive.

The disturbance source 20 is to change a detected output from the electromagnetic field devices 101, and to specifically generate a disturbance component of a detected output (disturbance component) due to the magnetic wiring 12 added to the recording paper 10 serving as a detecting object, and for example, there may be a disturbance source having a magnetic body of a semi-hard magnetic material whose coercivity is greater than that of the magnetic wiring 12. As a semi-hard magnetic material, there are, for example, iron base, nickel-iron base, Fe—Cu base, Fe—Mn base, and Fe—Cr—Co base (cold-rolled steel strip) materials, and their coercivity are approximately 10 to 500 Oe.

These are materials which are enhanced in their coercivity to be greater than the values of the original materials due to rolling, simulated annealing, composition ratios of alloy materials, and the like. That is, the materials have, not the properties of the original materials, but the characteristics due to "induced magnetic anisotropy" or "inverse magnetostriction effect." The "induced magnetic anisotropy" is magnetic anisotropy caused by anisotropy in atom arrangement generated by thermal treatment and the like, and the "inverse magnetostriction effect" is a phenomenon that a response to a magnetic field of the magnetic body is changed by distorting a magnetic body.

The disturbance source 20 composed of a magnetic body of a semi-hard magnetic material maybe formed overall of a semi-hard magnetic material, or may partially include a magnetic body of a semi-hard magnetic material. For example, those that are used heavily as general-purpose goods, and there are many of those in workplaces (offices). In detail, those correspond to beverage steel cans, clocks, bags (with iron clasps), cans for milk, notebook personal computers and batteries (Fe, Ni, Co) used therefor, stainless-steel umbrella ribs (Fe, C, Si, Tb, Mn, Cr), (semi-hard) nails, and the like. As another disturbance source 20, there is chromel-alumel whose coercivity is approximately 5 Oe, that is used for thermocouple goods or the like.

As behavior of a detected waveform from the disturbance source 20 in the gate (i.e., a detecting area of the electromagnetic field gate 100), in the case in which the coercivity of the disturbance source 20 is greater than a maximum excitation magnetic field (proximate to the antennas), there is the featured point that the disturbance source 20 does not magnetically saturate at any position regardless of whether the disturbance source 20 is proximate to the electromagnetic field devices 101 (the generated magnetic field is strong) or in the central area of the electromagnetic field gate 100 (the generated magnetic field is weak), and a change in magnetic output (i.e., a change in waveform amplitude) due to a minor loop so as to correspond to an excitation field intensity is brought about, but its phase is not changed in accordance with a change in a generated magnetic field intensity (i.e., according to a position of passage). On the other hand, in the case in which the coercivity of the disturbance source 20 is less than the maximum excitation magnetic field, there is the featured point that the disturbance source 20 is magnetically saturated at a position at which a generated magnetic field is greater than the coercivity of the disturbance source 20, and when the disturbance source 20 is magnetically saturated, a phase of the waveform is changed in accordance with a position of passage. These points will be described in detail later.

In the respective electromagnetic field devices 101, exciting windings 102 (exciting coils) that generate a magnetic field for magnetizing the magnetic wiring 12 added to the recording paper 10 and detecting windings 104 (detecting coils) that detect a magnetization reverse pulse from the magnetic wiring 12 onto which magnetization reversal has been applied by the exciting windings 102 are incorporated.

The respective electromagnetic field devices 101 are disposed such that their exciting windings 102 and detecting windings 104, respectively, face each other. One of the exciting windings 102 is connected to excitation unit 200. The excitation unit 200 conducts an alternating current of several hundred Hz to several KHz (for example, 300 Hz to 3 KHz) into the exciting winding 102 to generate an alternating field from the exciting winding 102. A maximum excitation magnetic field of the electromagnetic field gate 100 maximum magnetic field intensity: a value at a position proximate to the electromagnetic field devices 101) is, for example, approximately 10 to 20 Oe, and a gate interval (an interval between the pair of electromagnetic field devices 101) is determined such that the magnetic field intensities at the respective positions in the detecting area become greater than the coercivity of the magnetic wiring 12, to be approximately 1 to 20 Oe.

One of the detecting windings 104 is connected to the signal processing unit 300, and the detecting winding 104 detects an induced current due to a change in a magnetic field generated between the pair of electromagnetic field devices 101, and notifies the signal processing unit 300 of the detection signal. The signal processing unit 300 detects the presence of the magnetic wiring 12 between the electromagnetic field devices 101 on the basis of the induced current flowing in the detecting winding 104 due to a change in a magnetic field generated in the gate. As behavior of a detected waveform from the magnetic wiring 12 in the gate (i.e., the detecting area of the electromagnetic field gate 100), there is the featured point that the magnetic wiring 12 is magnetically saturated at any position, and its phase is changed in accordance with a position.

The detecting winding 104 detects an induced current generated due to a magnetic field being changed, to notify the signal processing unit 300 of it when a person with only the recording paper 10 (with the magnetic wiring 12) makes an attempt to pass through or a person with both of the recording paper 10 (with the magnetic wiring 12) and the disturbance source 20 makes an attempt to pass through between the pair of electromagnetic field devices 101.

The signal processing unit 300 converts the detected current into a voltage signal by analog signal processing and amplifies it. The amplified signal is called an analog terminal output signal. The signal processing unit 300 determines the presence or absence of a pulse signal corresponding to the magnetic wiring 12 on the basis of the analog terminal output signal.

In the case of absence of a pulse signal corresponding to the magnetic wiring 12, the signal processing unit 300 determines that a signal from the disturbance source is superimposed on the analog terminal output signal, and executes processing for suppressing the signal (disturbance signal) from the disturbance source 20 stored in advance from the analog terminal output signal, to generate a determination signal. That is, the signal processing unit 300 eliminates the detected output of the disturbance source 20 from detected outputs of the recording paper 10 (with the magnetic wiring 12) and the disturbance source 20, to extract the detected output of the recording paper 10 (with the magnetic wiring 12). Thereafter, the signal processing unit 300 compares the determination signal with a detected waveform of a sheet stored in advance, and when the waveform shapes are similar to one another (it can be determined that there is a correlation), the signal processing unit 300 determines that there is the recording paper 10 (with the magnetic wiring 12), and actuates an alarm device such as a lamp or a buzzer.

The processing for suppressing a signal from the disturbance source 20 means processing for decreasing the component of the disturbance source 20 contained in an analog terminal output signal as much as possible, and is not necessarily processing for eliminating the component of the disturbance source 20 completely.

For example, an alternating magnetic field is generated in the gate (electromagnetic field gate 100) by the exciting windings 102 provided to the right and left electromagnetic field devices 101 forming the gate. The magnetic wiring 12 has a property of generating a pulse signal by a relatively small alternating magnetic field (called a magnetic pulse). This magnetic pulse is a magnetic pulse according to a large Barkhausen effect which the magnetic wiring 12 has. That is, the magnetic wiring 12 has strong magnetic anisotropy in its axial direction by a magnetic effect due to its shape and crystal structure.

Then, when an alternating magnetic field with an amplitude greater than the coercivity of the magnetic wiring 12 is applied, at the moment when the magnetic field surpasses the coercivity, an extremely rapid magnetization reversal is brought about by a large Barkhausen effect. When the magnetization reversal is detected by the detecting windings 104 formed of solenoid coils, for example, a pulsed output (magnetic pulse) is obtained.

For example, when the recording paper 10 (with the magnetic wiring 12) passes through the gate, a magnetization reversal is brought about in the magnetic wiring 12 to which an alternating magnetic field generated in the gate is applied, which generates a rapid magnetic pulse. The signal processing unit 300 determines the presence or absence of the recording paper 10 (with the magnetic wiring 12) attempting pass through the gate by detecting an induced current based on the magnetic pulse by the detecting windings 104.

<Signal Processing: First Embodiment>
[Circuit Configuration]

FIGS. 2A and 2B are diagrams for explanation of a signal processing unit 300A of a first embodiment. As shown in FIG. 2A, the signal processing unit 300A of the first embodiment has an analog signal processing unit 302, an AD converter 304, and a digital signal processing unit 306. The analog signal processing unit 302 is an example of a detection signal acquiring unit that acquires a detection signal by detecting a signal generated in a magnetic body present in an alternating magnetic field, and has a preceding amplifier 312 having a current-voltage converter function and a voltage amplifier function, a band elimination wave filter circuit 314, and a subsequent amplifier 316 having a voltage amplifier function.

The preceding amplifier 312 converts an induced current signal S1 from the detecting winding 104 into a voltage signal, and amplifies it so as to have a constant-sized signal amplitude, to generate a detected voltage signal S2, and delivers the detected voltage signal S2 to the band elimination wave filter circuit 314.

The band elimination wave filter circuit 314 is an example of an alternating magnetic field component suppression processing unit that suppresses alternating magnetic field components from the detected voltage signal S2, and attenuates alternating magnetic field components from the detected voltage signal S2 by band elimination filter (notch filter) processing for attenuating excitation frequency components, to generate a detected voltage signal S3, and delivers the detected voltage signal S3 to the subsequent amplifier 316. Note that the suppression processing for attenuating alternating magnetic field components (excitation frequency components in an alternating magnetic field) means processing for decreasing alternating magnetic field components contained in an analog terminal output signal as much as possible, and is not necessarily processing for eliminating the alternating magnetic field components completely.

The subsequent amplifier 316 converts the detected voltage signal S3 into a signal with an amplitude and a DC level suitable for a conversion range of the AD converter 304, to generate a detected voltage signal S4, and delivers the detected voltage signal S4 to the AD converter 304.

The AD converter 304 converts the analog detected voltage signal S4 into a digital signal to generate an analog terminal output signal D1, and delivers the analog terminal output signal D1 to the digital signal processing unit 306.

The digital signal processing unit 306 has a waveform storage processing unit 330, a determination signal generating unit 340, and a detecting object determination processing unit 350.

As shown in FIG. 2B, the waveform storage processing unit 330 has a detecting object detection signal storage unit 334 and a disturbance source detection signal storage unit 332. The disturbance source detection signal storage unit 332 stores an analog terminal output signal D1_20 (from which alternating magnetic field components are eliminated) in a state in which a detected output waveform from the electromagnetic field devices 101 in a state in which only the reference disturbance source 20 is located in a reference direction at a reference position is located in the reference direction at the reference position between the electromagnetic field devices 101 facing each other. The detecting object detection signal storage unit 334 stores an analog terminal output signal D1_10 (from which alternating magnetic field components are eliminated) in a state in which only the recording paper 10 (with the magnetic wiring 12) is disposed in a reference direction at a reference position between the electromagnetic field devices 101 facing each other.

The reference disturbance source 20 may be a typical disturbance source (one) among goods envisioned to pass through the electromagnetic field gate 100 along with the recording paper 10 (with the magnetic wiring 12). For example, a beverage steel can with a typical size and a typical shape may be the reference disturbance source 20.

With respect to both of the recording paper 10 (with the magnetic wiring 12) and the disturbance source 20, the reference positions are, for example, the central area between the electromagnetic field devices 101 facing each other. The reference direction for the recording paper 10 (with the magnetic wiring 12) is, for example, a state in which the direction of the vertical line (an arrow 10X in FIG. 1B) with respect to the plane of the recording paper 10 (with the magnetic wiring 12) is directed in the X-axis direction. The reference direction for the disturbance source 20 is, for example, a state in which taking a width, a length, and a height of the disturbance source 20 into consideration, the width is set to the X-axis direction, the length is set to the Y-axis direction, and the height is set to the Z-axis direction.

The determination signal generating unit 340 has a disturbance component determining unit 343, an amplitude correction unit 344, and a disturbance component suppression processing unit 348. The disturbance component determining unit 343 determines whether or not disturbance components are contained in a detection signal (an analog terminal output signal D1_0) acquired by the analog signal processing unit 302 as an example of the detection signal acquiring unit. When it is determined by the disturbance component determining unit 343 that disturbance components are contained in the analog terminal output signal D1_0, the amplitude correction unit 344 corrects an amplitude of a detection signal (an analog terminal output signal D1_20) of the reference disturbance source read out of the disturbance source detection signal storage unit 332 so as to correspond to an amplitude of the analog terminal output signal D1_0 serving as the detection signal.

In detail, the amplitude correction unit 344 corrects an amplitude of the analog terminal output signal D1_20 stored in the disturbance source detection signal storage unit 332 so as to correspond to an amplitude of the component of the disturbance source 20 in the analog terminal output signal D1_0 (waveform information of the recording paper 10 (with the magnetic wiring 12)+the disturbance source 20") when the recording paper 10 (with the magnetic wiring 12) and the disturbance source 20 together pass through between the electromagnetic field devices 101 (the gate) facing each other, to generate an amplitude-corrected disturbance source detection signal D2. The processing for correcting an amplitude may be, for example, processing for multiplying the analog terminal output signal D1_20 of the disturbance source 20 by a coefficient such that an amplitude of the analog terminal output signal D1_0 and an amplitude of the amplitude-corrected disturbance source detection signal D2 correspond to one another.

The term "such that amplitudes correspond to one another" is not limited to the meaning that amplitudes of the analog terminal output signal D1_0 and the amplitude-corrected disturbance source detection signal D2 completely correspond to one another, but there may be a difference in amplitudes of both waveforms to some extent. However, when there is a difference, the component of the disturbance source 20 remains in a determination signal DET. Therefore, both amplitudes may be optimally made to completely correspond to one another.

Note that a low-pass wave filter circuit 342 (low-pass filter) may be provided as an example of the detecting object component suppression processing unit that suppresses components of the recording paper 10 (with the magnetic wiring 12) in the analog terminal output signal D1_0 at the preceding stage of the amplitude correction unit 344. In the case in which amplitude correction is applied onto the analog terminal output signal D1_20 such that an amplitude of the amplitude-corrected disturbance source detection signal D2 is made to simply correspond to an amplitude of the analog terminal output signal D1_0, when a magnetic pulse component by the magnetic wiring 12 is superimposed in the vicinity of a crest value (a peak level or a bottom level) of the analog terminal output signal D1_0, it is impossible to perform appropriate amplitude correction under the effect of the magnetic pulse component.

In order to avoid this problem, it is recommended that low-pass filter processing be executed so as to suppress/eliminate the effect of the magnetic pulse component by the magnetic wiring 12 in the low-pass wave filter circuit 342, to appropriately acquire an amplitude of the component of the disturbance source 20 in the analog terminal output signal D1_0. Then, an amplitude of the analog terminal output signal D1_20 is corrected so as to correspond to the amplitude of the analog terminal output signal D1_0 which has been subjected to the low-pass filter processing, in the amplitude correction unit 344, to generate the amplitude-corrected disturbance source detection signal D2.

The disturbance component suppression processing unit 348 executes arithmetic processing of the amplitude-corrected disturbance source detection signal D2 and the analog terminal output signal D1_0, and calculates a signal waveform in which an effect by the disturbance source 20 is suppressed to generate a determination signal DET, and delivers it to the detecting object determination processing unit 350. The processing for suppressing an effect by the disturbance source 20 may be, for example, processing for subtracting the amplitude-corrected disturbance source detection signal D2 of the disturbance source 20 from the analog terminal output signal D1_0. The detecting object determination processing unit 350 has a correlation processing unit 352 and a determination unit 354. The correlation processing unit 352 compares the features of the analog terminal output signal D1_10 stored in the detecting object detection signal storage unit 334 and the determination signal DET generated in the disturbance component suppression processing unit 348, to find a degree of similarity RES denoting a correlation between both. When the degree of similarity RES found in the correlation processing unit 352 is greater than or equal to a predetermined threshold value, i.e., when there is a similarity in the waveform of the determination signal DET and the analog terminal output signal D1_10, which is greater than or equal to a given value, the determination unit 354 determines that the recording paper 10 (with the magnetic wiring 12) is present (passes through).

[Detecting Processing: Basics]

Figure 3:
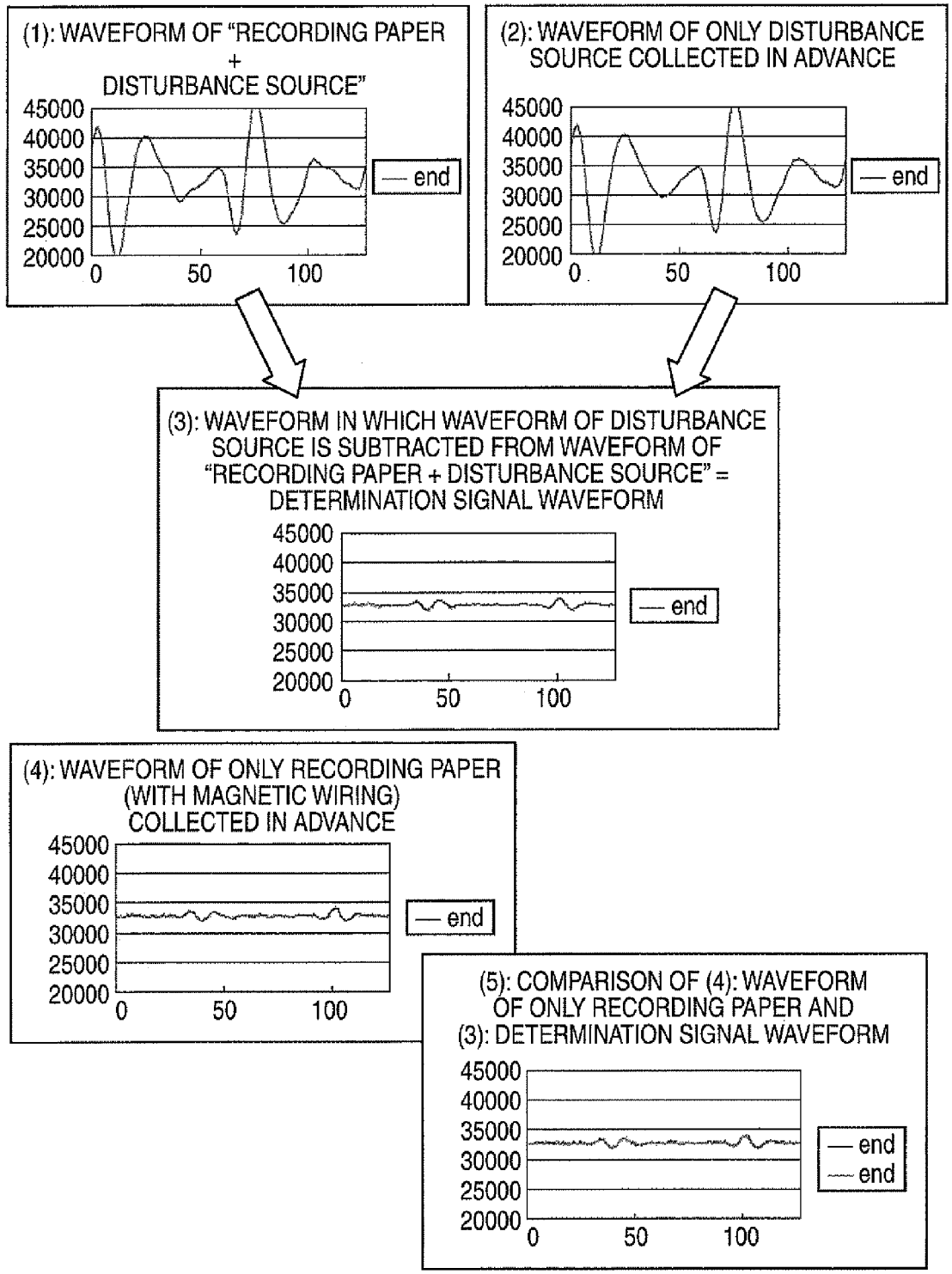
FIG. 3 is diagram for explanation of the basics of object detecting processing.

FIG. 3 is diagram for explanation of the basics of object detecting processing. Here, a case in which the recording paper 10 (with the magnetic wiring 12) and the disturbance source 20 are brought by a same person to pass through the electromagnetic field gate 100 is shown. Note that it is assumed that a position through which the recording paper 10 (with the magnetic wiring 12) and the disturbance source 20 pass, is a position similar to a position of collecting the analog terminal output signal D1_20.

(1) of FIG. 3 shows an example of a detected waveform from "the recording paper 10 (with the magnetic wiring 12)+ the disturbance source 20," which is specified by the analog terminal output signal D1_0. (2) of FIG. 3 shows an example of a detected waveform from the disturbance source 20 collected in advance, which is specified by the analog terminal output signal D1_20. (3) of FIG. 3 is an example of a waveform in which the detected waveform from the disturbance source 20 ((2) of FIG. 3) is subtracted from the detected waveform from "the recording paper 10 (with the magnetic wiring 12)+the disturbance source 20" ((!) of FIG. 3), that corresponds to an example of a waveform specified by the determination signal DET in a state in which the amplitude correction unit 344 is not activated. (4) of FIG. 3 shows an example of a detected waveform from the recording paper 10 (in detail, the magnetic wiring 12) collected in advance, which is specified by the analog terminal output signal D1_10. (5) of FIG. 3 is a diagram in which the waveform specified by the determination signal DET shown in (3) of FIG. 3 and the detected waveform from the recording paper 10 (with the magnetic wiring 12) shown in (4) of FIG. 3 are compared.

Figure 1B:
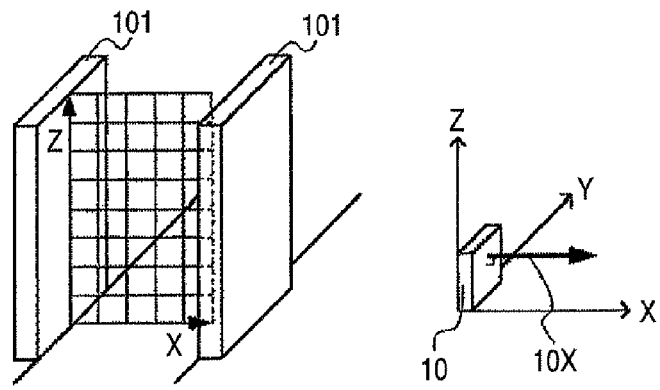

As shown in FIGS. 1A and 1B, in some cases, a person passing through the gate with not only the recording paper 10 (with the magnetic wiring 12), but also the disturbance source 20 composed of a magnetic body such as a metal material goes into the gate. In this case, the problem that it is impossible with high precision to detect a signal from the magnetic wiring 12 provided to the recording paper 10 to be primarily detected is brought about. This is because an object (a notebook personal computer or a steel can) disturbing a detected output from the electromagnetic field devices 101 serves as the disturbance source 20, and a signal from a magnetic body equipped therein is detected, to mix the signal with a rapid magnetic pulse generated from the magnetic fibers 102 to disturb the detection signal, which makes the following determination difficult.

Then, the present embodiment adopts a mechanism in which a disturbance waveform by the disturbance source 20 is stored in advance, and an arithmetic operation of a detection signal waveform and the stored disturbance waveform is carried out, which makes it possible with high precision to detect a signal from the magnetic wiring 12 more than a case in which the present embodiment is not applied.

First, a detected output waveform of only the recording paper 10 (with the magnetic wiring 12) from the electromagnetic field devices 101 is stored in advance in a memory or the like. In addition thereto, in the present embodiment, a detected output waveform of only the disturbance source 20 as a reference from the electromagnetic field devices 101 is stored in advance in a memory or the like.

For example, as shown in (2) of FIG. 3, in the case in which only the disturbance source 20 is present in the detecting area of the electromagnetic field gate 100, a disturbance waveform by the disturbance source 20 is obtained by the analog signal processing unit 302, and the disturbance waveform is digitized by the AD converter 304, to be stored as an analog terminal output signal D1_20 denoting the disturbance waveform in the disturbance source detection signal storage unit 332.

As shown in (4) of FIG. 3, in the case in which only the recording paper 10 (with the magnetic wiring 12) is present in the detecting area of the electromagnetic field gate 100, a pulse waveform corresponding to a magnetic pulse by the magnetic wiring 12 added to the recording paper 10 is obtained by the analog signal processing unit 302, and the pulse waveform is digitized by the AD converter 304, to be stored as an analog terminal output signal D1_10 denoting the recording paper 10 (with the magnetic wiring 12) in the detecting object detection signal storage unit 334.

When the recording paper 10 (with the magnetic wiring 12) and an unspecified disturbance source 20 are together brought into the detecting area of the electromagnetic field gate 100 at the time of monitoring passage, as a signal waveform obtained by the analog signal processing unit 302, as shown in (1) of FIG. 3, a signal waveform such that a pulse waveform corresponding to the magnetic wiring 12 and a disturbance waveform by the disturbance source 20 are overlapped is obtained. Because the position through which the recording paper 10 (with the magnetic wiring 12) and the disturbance source 20 pass, is a position similar to a position of collecting the analog terminal output signal D1_20, both waveforms are substantially the same in amplitude and in shape regardless of whether or not the reference disturbance source 20 and the unspecified disturbance source 20 are of the same type.

The determination signal generating unit 340 executes processing for suppressing a waveform signal of the disturbance source 20 from the analog terminal output signal D1_0 in a status of normal use for the purpose of detecting the recording paper 10 (with the magnetic wiring 12).

As shown in (3) of FIG. 3, a pulse signal corresponding to the magnetic wiring 12 is detected from the signal waveform on which the disturbance suppression processing has been executed in the determination signal generating unit 340, and even if the recording paper 10 (with the magnetic wiring 12) and the disturbance source 20 are together brought into the detecting area of the electromagnetic field gate 100, the recording paper 10 (with the magnetic wiring 12) is detected.

That is, it is found as shown in (5) of FIG. 3 that the waveform is made similar in shape (there is a correlation) to the sheet waveform collected in advance (the detected waveform of the magnetic wiring 12 shown in (4) of FIG. 3) by executing the disturbance suppression processing by an arithmetic operation with the detected waveform from the disturbance source 20 (for example, by taking a difference therebetween).

[Detecting Processing: First Embodiment]

FIG. 4 is diagram for explanation of object detecting processing of the first embodiment. Here, in the same way as in FIG. 3, a case in which the recording paper 10 (with the magnetic wiring 12) and the disturbance source 20 are brought by a same person to pass through the electromagnetic field gate 100 is shown.

(1) of FIG. 4 shows an example of a detected waveform from the disturbance source 20 collected in advance, which is specified by the analog terminal output signal D1_20. (2) of FIG. 4 is an example of a detected waveform from the disturbance source 20 in which a detected waveform from the disturbance source 20 collected in advance is made to correspond to an amplitude of a detected waveform from "the recording paper 10 (with the magnetic wiring 12)+the disturbance source 20," that corresponds to an example of a waveform specified by the amplitude-corrected disturbance source detection signal D2 output from the amplitude correction unit 344 serving as a characteristic functional part of the present embodiment.

(3) of FIG. 4 shows an example of a detected waveform from "the recording paper 10 (with the magnetic wiring 12)+the disturbance source 20" specified by the analog terminal output signal D1_0. (4) of FIG. 4 is an example of a waveform in which the waveform specified by the amplitude-corrected disturbance source detection signal D2 ((2) of FIG. 4) is subtracted from the detected waveform from "the recording paper 10 (with the magnetic wiring 12)+the disturbance source 20" ((3) of FIG. 4), that corresponds to an example of a waveform specified by the determination signal DET in a state in which the amplitude correction unit 344 is activated. (5) of FIG. 4 shows an example of a detected waveform from the recording paper 10 (with the magnetic wiring 12) collected in advance, which is specified by the analog terminal output signal D1_10. (6) of FIG. 4 is a diagram in which the waveform specified by the determination signal DET shown in (4) of FIG. 4 and the detected waveform from the recording paper 10 (with the magnetic wiring 12) shown in (6) of FIG. 4 are compared.

Note that it is assumed that the coercivity (Hc) of the disturbance source 20 is greater than a maximum excitation magnetic field (proximate to the antennas). In this case, as behavior of a detected waveform from the disturbance source 20 in the gate, because the disturbance source 20 is not magnetically saturated regardless of a position of gate passage, its amplitude is changed, but its phase is not changed in accordance with a position of passage (refer to a second embodiment which will be described later in detail).

There is a difference between the basics of the detecting processing described above and the first embodiment in the point that a position through which the recording paper 10 (with the magnetic wiring 12) and the disturbance source 20 pass is different from a position of collecting the analog terminal output signal D1_20. That is, the object detecting apparatus 1 of the first embodiment has the featured point that it is possible to cope with a case in which a position of the disturbance source 20 whose detected waveform is collected in advance and a position of "the recording paper 10 (with the magnetic wiring 12)+the disturbance source 20" are different from each other.

In order to cope with the case, the present embodiment adopts a technique in which an amplitude of a detected waveform from the disturbance source 20 collected in advance is made to fit in an amplitude of a detected waveform from "the recording paper 10 (with the magnetic wiring 12)+the disturbance source 20." Thereafter, in the same way as the basics of the processing, an arithmetic operation of the amplitude-corrected disturbance source detection signal D2 and the analog terminal output signal D1_0 is carried out to generate a determination signal DET, and the presence or absence of the recording paper 10 (with the magnetic wiring 12) is determined on the basis of the degree of similarity with the detected waveform from the recording paper (with the magnetic wiring 12) collected in advance. Hereinafter, this will be described concretely.

The mechanism described in Japanese Published Unexamined Patent Application No. 2008-020346 is to "store a signal waveform from an envisioned disturbance source in advance," and if there are plural types of waveforms of envisioned disturbance sources, it is fundamental that the plurality of types of respective waveforms are stored in advance. Therefore, there is a disadvantage that stored information is increased. In order to decrease waveform information to be stored, there has been proposed a technique in which a maximum value, a minimum value, and a mean value are stored as well. However, because the technique takes three-dimensional orientation into consideration, there is still the disadvantage that stored information is increased. Additionally, processing for acquiring signal waveforms in respective positional relationships, and thereafter, processing for specifying a maximum value or a minimum value and processing for calculating a mean value are needed, which brings about a disadvantage that waveform storage processing is made cumbersome and complicated.

For example, when there are plural types of known objects, plural signals generated from the plurality of known objects are respectively acquired to be stored in advance. Further, on the basis of the fact that, even if plural objects are the same, signal waveforms therefrom are different from each other depending on positional relationships of the disturbance sources between the respective electromagnetic field devices 101, plural signal waveforms detected in accordance with directions of passage or positions of passage of the known objects are stored so as to correspond to the respective disturbance sources.

At this time, after the signal waveforms in the respective positional relationships are acquired, for example, maximum signal waveforms and minimum signal waveforms when the objects are directed in the respective axial directions are specified with respect to the respective X-axis, Y-axis, and Z-axis, and mean signal waveforms when the objects face in the respective axial directions are calculated. Moreover, a maximum signal waveform and a minimum signal waveform independent of a direction are specified, and a mean signal waveform independent of a direction is calculated, and those are stored.

On the other hand, the present embodiment has the featured point that a signal waveform (basically only one is enough) generated when the reference disturbance source 20 is placed in a reference location mode in the electromagnetic field gate 100 or made to pass through the electromagnetic field gate 100 is stored regardless of types of the disturbance sources 20 and location modes (positional relationships) of the disturbance sources 20 between the respective electromagnetic field devices 101. This is based on the fact that it is found that signal waveforms to be detected are made different depending on directions of passage or positions of passage of objects, and signal waveforms from which alternating magnetic field components are eliminated are, although depending on a relationship between alternating magnetic field intensity and its coercivity, merely different in amplitude characteristic and in phase characteristic, and those entire shapes have basically similar figures, and there is a correlation among them.

That is, in the present embodiment, before the determination signal DET is generated from the analog terminal output signal D1, a detected output waveform from the electromagnetic field devices 101 in a state in which only the recording paper 10 (with the magnetic wiring 12) is located in the reference direction at the reference position, and a detected output waveform from the electromagnetic field devices 101 in a state in which only the reference disturbance source 20 is located in the reference direction at the reference position are respectively stored in a memory or the like.

For example, as shown in (1) of FIG. 4, in the case in which only the disturbance source 20 is present in the detecting area of the electromagnetic field gate 100, a disturbance waveform by the disturbance source 20 is obtained by the analog signal processing unit 302, and the disturbance waveform is digitized by the AD converter 304, to be stored as an analog terminal output signal D1_20 denoting the disturbance waveform in the disturbance source detection signal storage unit 332. This storage processing is different from that in Japanese Published Unexamined Patent Application No. 2008-020346, and is sufficient to store a measured result (which is basically one detected waveform) in a state in which the reference disturbance source 20 is located in the reference direction at the reference position regardless of the type of the disturbance source and the positional relationship of the disturbance source between the respective electromagnetic field devices 101.

As shown in (5) of FIG. 4, in the case in which only the recording paper 10 (with the magnetic wiring 12) is present in the detecting area of the electromagnetic field gate 100, a pulse waveform corresponding to a magnetic pulse by the magnetic wiring 12 added to the recording paper 10 is obtained by the analog signal processing unit 302, and the pulse waveform is digitized by the AD converter 304, to be stored as an analog terminal output signal D1_10 denoting the recording paper 10 (with the magnetic wiring 12) in the detecting object detection signal storage unit 334.

When the recording paper 10 (with the magnetic wiring 12) and the disturbance source 20 are together brought into the detecting area of the electromagnetic field gate 100, as a signal waveform obtained by the analog signal processing unit 302, as shown in (3) of FIG. 4, a signal waveform such that a pulse waveform corresponding to the magnetic wiring 12 and a disturbance waveform by the disturbance source 20 are overlapped is obtained. Because the position through which the recording paper 10 (with the magnetic wiring 12) and the disturbance source 20 pass is a position different from a position of collecting the analog terminal output signal D1_20, both waveforms are substantially the same in shape, but different in amplitude.

Then, in the first embodiment, an amplitude of a detected output waveform of the disturbance source 20 stored in the disturbance source detection signal storage unit 332 in a state in which the disturbance source 20 is located in the reference direction at the reference position is made to correspond to an amplitude of the actual analog terminal output signal D1_20. Thereafter, an arithmetic operation (a calculation of a difference) of these waveforms is carried out, and thereby, the signal waveform of the disturbance source 20 is eliminated from the analog terminal output signal D1_0, to generate the determination signal DET. For example, the amplitude correction unit 344 corrects an amplitude of the analog terminal output signal D1_20 collected in a state in which the disturbance source 20 is located in the reference direction at the reference position in advance, so as to correspond to an amplitude of the component of the disturbance source 20 in the analog terminal output signal D1_0 of "the recording paper 10 (with the magnetic wiring 12)+the disturbance source 20." Thereby, a detected waveform from the disturbance source 20 whose amplitude is corrected, which is specified by the amplitude-corrected disturbance source detection signal D2 as shown in (2) of FIG. 4, is generated.

Then, the determination signal generating unit 340 executes disturbance suppression processing in which the detected waveform from the disturbance source 20 whose amplitude is corrected, which is envisioned to pass through the gate, is subtracted from the analog terminal output signal D1_0 in a status of normal use for the purpose of detecting the recording paper 10 (with the magnetic wiring 12). Thereby, the signal waveform of the disturbance source 20 is eliminated from the analog terminal output signal D1_0, to generate the determination signal DET.

In this case as well, in the same way as the mechanism in Japanese Published Unexamined Patent Application No. 2008-020346, the component of the disturbance source 20 is eliminated with high precision from the analog terminal output signal D_10 of "the recording paper 10 (with the magnetic wiring 12)+the disturbance source 20," and a detected output similar to the analog terminal output signal D1_10 by the recording paper 10 (with the magnetic wiring 12) is extracted. The following degree of similarity determination processing for the recording paper 10 (with the magnetic wiring 12) with the analog terminal output signal D1_10 is as described above.

For example, a pulse signal corresponding to the magnetic wiring 12 is detected, as shown in (4) of FIG. 4, from the signal waveform on which the disturbance suppression processing has been executed in the determination signal generating unit 340. An output after the disturbance suppression processing is set as the determination signal DET, and the determination signal DET is compared with the analog terminal output signal D1_10, which is stored in advance, by the recording paper 10 (with the magnetic wiring 12). When those waveform shapes are similar (there is a correlation), it is determined that there is the recording paper 10 (with the magnetic wiring 12), and an alarm device such as a lamp or a buzzer is actuated. Even if the recording paper 10 (with the magnetic wiring 12) and the disturbance source 20 are together brought into a position different from a position of collecting the analog terminal output signal D1_20 in the detecting area of the electromagnetic field gate 100, the recording paper 10 (with the magnetic wiring 12) is detected without inconvenience.

<Signal Processing: Second Embodiment>
[Circuit Configuration]

Figure 5A:
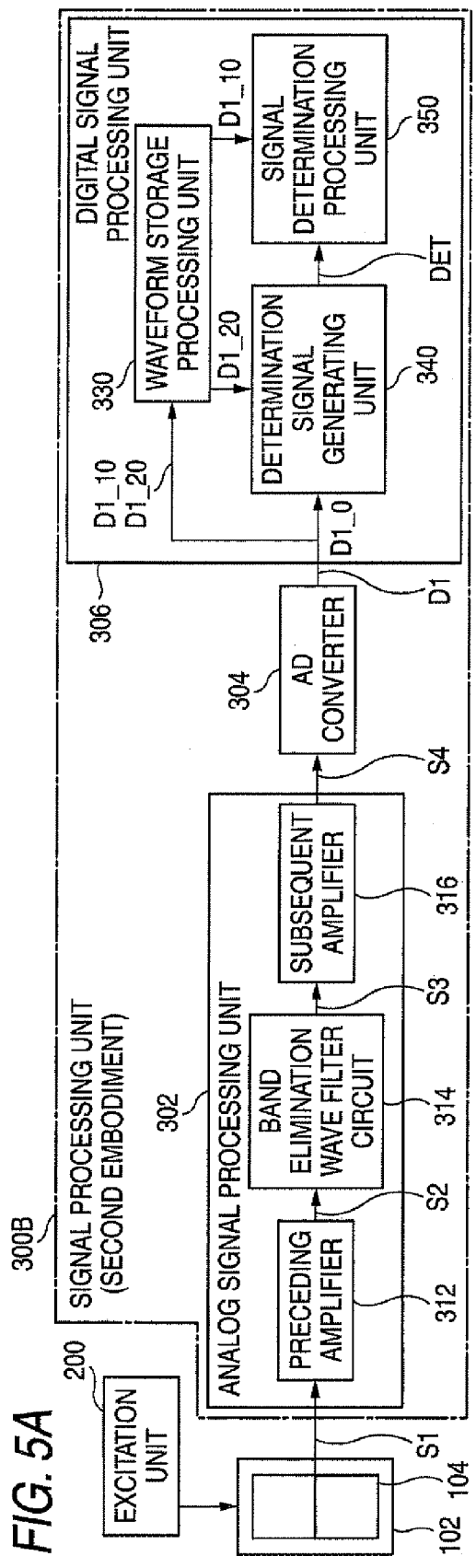
FIGS. 5A and 5B are diagrams for explanation of a signal processing unit of a second embodiment.
Figure 5B:
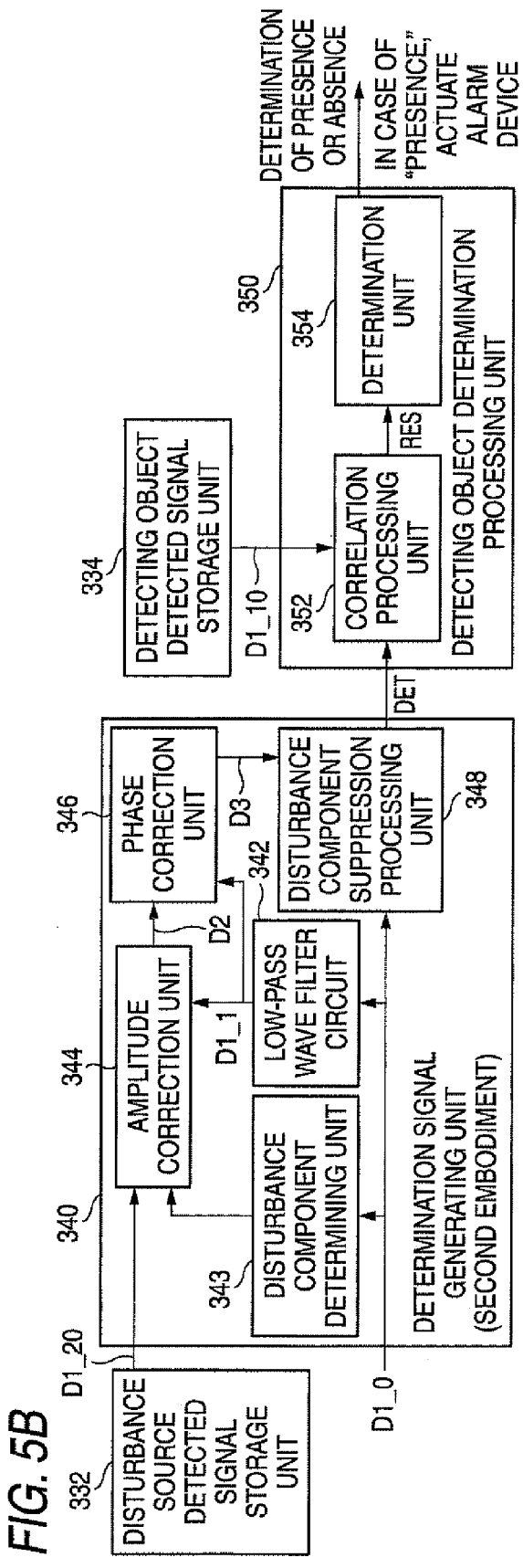

FIGS. 5 are diagrams for explanation of a signal processing unit 300B of the second embodiment. The second embodiment has the featured point that it is possible to cope with a case in which the coercivity of the disturbance source 20 is less than a maximum excitation magnetic field. In order to cope with the case, the signal processing unit 300B of the second embodiment includes a phase correction unit 346 as a different point from the signal processing unit 300A of the first embodiment.

In order to cope with the case in which the coercivity of the disturbance source 20 is greater than a maximum excitation magnetic field as well, i.e., in order to determine the presence or absence of the recording paper 10 (with the magnetic wiring 12) regardless of a level of coercivity of the disturbance source 20, as shown in the drawing, it is recommended that the amplitude correction unit 344 be provided. In the drawing, the phase correction unit 346 is disposed at the subsequent stage of the amplitude correction unit 344. However, inversely, the phase correction unit 346 may be disposed at the preceding stage of the amplitude correction unit 344. In the case in which the low-pass wave filter circuit 342 is provided, it is recommended that the phase correction unit 346 be disposed between the low-pass wave filter circuit 342 and the amplitude correction unit 344.

The processing for correcting a phase may be, for example, processing for transferring a phase of the analog terminal output signal D1_20 of the disturbance source 20 such that a phase of the analog terminal output signal D1_0 and a phase of a phase-corrected disturbance source detection signal D3 are made to correspond to one another.

The term "such that phases are made to correspond to one another" is not limited to the meaning that phases of the analog terminal output signal D1_0 and the phase-corrected disturbance source detection signal D3 are made to completely correspond to one another, but there may be a difference in phases of both waveforms to some extent. However, if there is a difference therebetween, the component of the disturbance source 20 remains in the determination signal DET. Therefore, both phases may be optimally made to completely correspond to one another.

For example, the phase correction unit 346 transfers (shifts) a phase of a detected waveform from the disturbance source 20 collected in advance in a state in which the disturbance source 20 is located in the reference direction at the reference position, to generate the phase-corrected disturbance source detection signal D3. For example, the phase correction unit 346 generates one or more phase-corrected disturbance source detection signals D3_* (* denotes a phase-shift amount) in which a phase of the analog terminal output signal D1_20 denoting the detected waveform from the disturbance source 20 collected in advance is shifted in a range from 0 to 90 degrees, to deliver those to the disturbance component suppression processing unit 348.

The disturbance component suppression processing unit 348 executes arithmetic processing of the respective phase-corrected disturbance source detection signals D3_* and the analog terminal output signal D1_0, and calculates a signal waveform in which the effect by the disturbance source 20 is suppressed to generate a determination signal DET, and delivers it to the detecting object determination processing unit 350. The processing for suppressing the effect by the disturbance source 20 may be, for example, processing for subtracting the phase-corrected disturbance source detection signals D3_* of the disturbance source 20 from the analog terminal output signal D1_0.

Simply considering the determination signal DET delivered to the detecting object determination processing unit 350, determination signals corresponding to the respective phase-corrected disturbance source detection signals D3_* are respectively generated. In this case, the detecting object determination processing unit 350 compares each of the plurality of determination signals DET_* having different phase-shift amounts corresponding to the respective phase-corrected disturbance source detection signals D3_* with the detected waveform from the recording paper 10 (with the magnetic wiring 12) collected in advance to be stored in the detecting object detection signal storage unit 334. Then, when it can be determined that any one of the plurality of determination signals DET_* having different phase-shift amounts is similar in waveform shape to the detected waveform, it is determined that there is the recording paper 10 (with the magnetic wiring 12). This technique is called a first phase correction processing function.

Further, as a modification, there may be an example in which the phase correction unit 346 supplies one phase-corrected disturbance source detection signal D3 in advance whose phase corresponds (or is substantially equal) thereto, to the disturbance component suppression processing unit 348, to generate a determination signal DET with less phase difference in the disturbance component suppression processing unit 348, and this is supplied for degree of similarity determination processing with a pulse signal of the recording paper 10 (with the magnetic wiring 12) in the detecting object determination processing unit 350. This technique is called a second phase correction processing function.

For example, first, the phase correction unit 346 generates plural phase-corrected disturbance source detection signals D3_* whose phases are gradually different from each other. Thereafter, processing of differences between those and the detected waveform from the disturbance source 20 collected in advance to be stored in the disturbance source detection signal storage unit 332 is executed at every sampling point, and the results of differences at the respective sampling points are synthesized. When the analog terminal output signal D1_20 and the phase-corrected disturbance source detection signals D3_* are the same in amplitude and the same in waveform shape, a synthesized value of the results of differences comes to zero when the phases completely correspond to one another.

Accordingly, some signals (which may be plural signals) whose synthesized values of the results of differences with the analog terminal output signal D1_20 are less (smaller) than a predetermined threshold value, or preferably, one signal having a minimum synthesized value among the plurality of the phase-corrected disturbance source detection signals D3_*whose phases are gradually different from each other, are determined as signals with less phase difference, and only those signals are delivered as the phase-corrected disturbance source detection signals D3 to the disturbance component suppression processing unit 348. As entire processing, the processing for generating the phase-corrected disturbance source detection signals D3 with less phase difference, whose phases correspond or are similar thereto, may become easier than the processing in which the degree of similarity determination in the detecting object determination processing unit 350 is carried out for each of the plurality of the determination signals DET_*.

Further, as another modification, for example, there is brought about a case in which, given that magnetic field intensity in the gate is 1 to 20 Oe and coercivity of a disturbance source is 19 Oe, the disturbance source is magnetically saturated (=its phase is shifted) in an area by several centimeters from and proximate to the gate, but is not magnetically saturated in the other area (=its phase is not shifted). A disturbance source having such coercivity may be handled with one determination signal with a phase-shift amount of several degrees.

[Detecting Processing: Second Embodiment]

FIGS. 6 and 7 are diagrams for explanation of object detecting processing of the second embodiment. The drawings are for explanation of situations of phase shifting with respect to excitation magnetic field periods of waveforms due to a difference in coercivity of the disturbance sources 20 whose detected waveforms are collected in advance, and a technique of coping therewith. Here, in the same way as in FIGS. 3 and 4, a case in which the recording paper 10 (with the magnetic wiring 12) and the disturbance source 20 are brought by a same person to pass through the electromagnetic field gate 100 is shown.

FIG. 6 is diagram showing a case in which the coercivity of the disturbance source 20 is greater than a maximum excitation magnetic field (proximate to the antennas). (1) of FIG. 6 shows a situation of a detected waveform when the disturbance source 20 is located at a position with the strongest generated magnetic field, which is proximate to the electromagnetic field devices 101 in the detecting area of the electromagnetic field gate 100. (2) of FIG. 6 shows a situation of a detected waveform when the disturbance source 20 is located at a position with a weak generated magnetic field, which is in the central area between the antennas in the detecting area of the electromagnetic field gate 100.

Because the coercivity of the disturbance source 20 is greater than the maximum excitation magnetic field (proximate to the antennas), as behavior of the detected waveform from the disturbance source 20 in the gate, because the disturbance source 20 is not magnetically saturated regardless of a position of gate passage, the detected waveform is changed in amplitude in accordance with a position of passage, but its phase is not changed (the phase with respect to an exciting coil current is not shifted according to a position).

In this case, as described in the first embodiment, it is recommended that the amplitude correction function by the amplitude correction unit 344 be activated to correct such that an amplitude of the analog terminal output signal D1_20 is made to correspond to an amplitude of the analog terminal output signal D1_0. Thereafter, by eliminating the signal waveform of the disturbance source 20 from the analog terminal output signal D1_0, the determination signal DET similar to the analog terminal output signal D1_10 by the recording paper 10 (with the magnetic wiring 12) is extracted. The following degree of similarity determination processing of the recording paper 10 (with the magnetic wiring 12) with the analog terminal output signal D1_10 is as described above.

On the other hand, FIG. 7 is diagram showing a case in which the coercivity of the disturbance source 20 is less than the maximum excitation magnetic field (proximate to the antennas). (1) of FIG. 7 shows a situation of a detected waveform when the disturbance source 20 is located at a position with the strongest generated magnetic field, which is proximate to the electromagnetic field devices 101 in the detecting area of the electromagnetic field gate 100. (2) of FIG. 7 shows a situation of a detected waveform when the disturbance source 20 is located at a position with magnetic field intensity less than that at the position proximate to the antennas, but at which a generated magnetic field is over the coercivity of the disturbance source 20, in the detecting area of the electromagnetic field gate 100.

As behavior of a detected waveform from the disturbance source 20 at the positions from (1) of FIG. 7 to (2) of FIG. 7, because disturbance source 20 is magnetically saturated with magnetic fields generated from the antennas, and a phase of the detected waveform is changed in accordance with a change in magnetic field intensity (a phase with respect to an exciting coil current is shifted according to a position).

In this case, it is recommended that the phase correction function by the phase correction unit 346 be activated to correct such that a phase of the analog terminal output signal D1_20 is made to correspond to a phase of the analog terminal output signal D1_0. This means that, in the case of the disturbance source 20 whose coercivity is less than magnetic field intensity generated by the electromagnetic field devices 101 of the electromagnetic field gate 100, a phase of a collected waveform is shifted to carry out an arithmetic operation.

For example, an arithmetic operation of the analog terminal output signal D1_0 and one or more waveforms in which the phase of the analog terminal output signal D1_20 denoting the detected waveform from the disturbance source 20 and stored in the disturbance source detection signal storage unit 332 is shifted in a range from 0 to 90 degrees, is carried out. Given that an excitation frequency by the excitation unit 200 is 1 kHz, and sampling in the AD converter 304 is 112 k/s, samplings are performed at 112 points during one excitation cycle (1 kHz). In the phase correction function, an arithmetic operation with waveforms in which a phase is shifted by one point (approximately three degrees) is carried out. Note that concrete processing of the phase correction function, may be any technique of the first and second phase correction processing functions as described above.

In this way, in both of the first and second phase correction processing functions, a change in waveform due to phase shifting is eliminated, and the effect of the waveform component of the disturbance source 20 that reliably has an effect on an output waveform is eliminated from the analog terminal output signal D1_0, and the presence or absence of the recording paper 10 (with the magnetic wiring 12) is determined.

The embodiments of the present invention have been described above. However, the technical scope of the present invention is not limited to the scope described in the above-described embodiments. Various modifications and improvements may be applied to the above-described embodiments within a range which does not deviate from the spirit of the invention. Embodiments to which such modifications and improvements are applied as well are incorporated in the technical scope of the present invention.

Further, the invention according to the aspects (claims) is not limited to the above-described embodiments, and all the combinations of the features described in the embodiments are not necessarily essential for the solving means of the invention. The inventions at various stages are included in the above-described embodiments, and the various inventions may be achieved due to the plurality of constituents which have been disclosed, being appropriately combined. Even if some of the constituents are omitted from all of the constituents shown in the embodiment, provided that the effects may be achieved, the configuration from which the constituents have been omitted may be achieved to be the present invention.

For example, the above-described embodiments have been described by use of the example in which the recording paper 10 (with the magnetic wiring 12) is detected. However, a detecting object for detecting that the object goes into the gate of the electromagnetic field gate 100, may be any detecting object to which the magnetic wiring 12 is provided, that is not particularly limited to a medium that is the recording paper 10. Further, the wire-formed magnetic wiring 12 to be provided to a detecting object may be any magnetic body having a large Barkhausen effect, that is not limited to the wire form, and is not limited to a medium that is a magnetic fiber.

The above-described embodiments have been described by use of an example in which one analog terminal output signal D1_20 obtained in a state in which one disturbance source 20 serving as a reference is placed in the detecting area of the electromagnetic field gate 100 in one location mode serving as a reference is stored in the disturbance source detection signal storage unit 332 regardless of the type of the disturbance source 20 or the location mode thereof in the electromagnetic field gate 100, to make a storage information amount of detected waveforms to be a minimum amount. However, this example is not essential for the invention.

For example, analog terminal output signals D1_20 in the respective location modes acquired in a state in which one disturbance source 20 serving as a reference is placed in the detecting area of the electromagnetic field gate 100 in plural reference location modes, may be stored. As the plurality of reference location modes, for example, positions of location (positions of passage) may be set as two places of a position proximate to the electromagnetic field devices 101 and the central area thereof, and directions of passage may be set in a state in which a direction of the vertical line with respect to the plane of the recording paper 10 (with the magnetic wiring 12) is directed to the respective X-axis direction, Y-axis direction, and Z-axis direction.

In accordance with the analysis of the inventors of the present application, it has been found that an amplitude difference or a phase difference may be generated in a detection signal (the analog terminal output signal D1) according to a location mode, but waveform shapes of the analog terminal output signal D1 have basically similar figures. However, this does not mean that the waveform shapes have complete similarity. Therefore, the analog terminal output signals D1_20 in plural location modes are stored, and the processing in the above-described embodiments is executed among those, to reduce the effect.

Further, the analog terminal output signals D1_20 of the respective disturbance sources 20 acquired in a state in which plural the disturbance sources 20 serving as a reference are placed in one reference location mode in the detecting area of the electromagnetic field gate 100, maybe stored. The plurality of the disturbance sources 20 may be, for example, distinguished types regardless of their shapes/sizes.

In accordance with the analysis of the inventors of the present application, it has been found that a phase difference maybe generated in a detection signal (the analog terminal output signal D1) according to the type of the disturbance source 20 (in detail a difference in coercivity), but waveform shapes of the analog terminal output signal D1 have basically similar figures. However, this does not mean that the waveform shapes have complete similarity. Therefore, the analog terminal output signals D1_20 in plural types of the disturbance sources 20 having different coercivity are stored, and the processing in the above-described embodiments is executed among those, to reduce the effect.

The foregoing description of the embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention defined by the following claims and their equivalents.

What is claimed is:

1. An object detecting apparatus that detects an object including a magnetic body, the object detecting apparatus comprising:
   a detection signal acquiring unit that acquires a detection signal including a signal indicative of an object based on a magnetic signal generated in a magnetic body receiving an alternating magnetic field;
   a disturbance source detection signal storage unit that stores, in advance, a detection signal of a disturbance source being preassigned as a reference, as a reference disturbance source detection signal,
   wherein the disturbance source includes a magnetic body that generates a disturbance component with respect to the detected signal including the signal indicative of the object, and
   the reference disturbance source detection signal has been acquired by the detection signal acquiring unit by exposing the disturbance source to the alternating magnetic field;
   a determining unit that determines whether or not the detection signal acquired by the detection signal acquiring unit contains the disturbance component;
   an amplitude correction unit that, when the determining unit determines that the disturbance component is contained in the detection signal, corrects an amplitude of the reference disturbance source detection signal read out of the disturbance source detection signal storage unit, so as to correspond to an amplitude of the detection signal acquired by the detection signal acquiring unit, to generate an amplitude-corrected disturbance source detection signal;
   a disturbance component suppression unit that generates a determination signal by suppressing the disturbance component contained in the detection signal based on the detection signal acquired by the detection signal acquiring unit and the amplitude-corrected disturbance source detection signal generated by the amplitude correction unit; and
   an object determination unit that determines whether or not the object receiving the alternating magnetic field is the object to be detected based on the determination signal generated by the disturbance component suppression unit.

2. An object detecting apparatus that detects an object including a magnetic body, the object detecting apparatus comprising:
   a detection signal acquiring unit that acquires a detection signal including a signal indicative of an object based on a magnetic signal generated in a magnetic body receiving an alternating magnetic field;
   a disturbance source detection signal storage unit that stores, in advance, a detection signal of a disturbance source present in a predetermined location, as a reference disturbance source detection signal,
   wherein the disturbance source includes a magnetic body that generates a disturbance component with respect to the detection signal including the signal indicative of the object, and
   the reference disturbance source detection signal has been acquired by the detection signal acquiring unit by exposing the disturbance source to the alternating magnetic field in the predetermined location;
   a determining unit that determines whether or not the detection signal acquired by the detection signal acquiring unit contains the disturbance component;
   an amplitude correction unit that, when the determining unit determines that the disturbance component is contained in the detection signal, corrects an amplitude of the reference disturbance source detection signal read out of the disturbance source detection signal storage unit, so as to correspond to an amplitude of the detection signal acquired by the detection signal acquiring unit, to generate an amplitude-corrected disturbance source detection signal;
   a disturbance component suppression unit that generates a determination signal by suppressing the disturbance component contained in the detection signal based on the detection signal acquired by the detection signal acquiring unit and the amplitude-corrected disturbance source detection signal generated by the amplitude correction unit; and an object determination unit that determines whether or not the object receiving the alternating magnetic field is the object to be detected based on the determination signal generated by the disturbance component suppression processing unit.

3. The object detecting apparatus according to claim 1, further comprising:

a phase correction unit that corrects a phase of the reference disturbance source detection signal read out of the disturbance source detection signal storage unit, so as to correspond to a phase of the detection signal acquired by the detection signal acquiring unit, to generate a phase-corrected disturbance source detection signal, wherein the disturbance component suppression unit generates a determination signal by suppressing the disturbance component contained in the detection signal based on the detection signal acquired by the detection signal acquiring unit, the amplitude-corrected disturbance source detection signal and the phase-corrected disturbance source detection signal.

4. The object detecting apparatus according to claim 2, further comprising:

a phase correction unit that corrects a phase of the reference disturbance source detection signal read out of the disturbance source detection signal storage unit, so as to correspond to a phase of the detection signal acquired by the detection signal acquiring unit, to generate a phase-corrected disturbance source detection signal, wherein the disturbance component suppression unit generates a determination signal by suppressing the disturbance component contained in the detection signal based on the detection signal acquired by the detection signal acquiring unit, the amplitude-corrected disturbance source detection signal and the phase-corrected disturbance source detection signal.

5. The object detecting apparatus according to claim 1 further comprising:

an alternating magnetic field generating unit that generates an alternating magnetic field, wherein the detection signal acquiring unit acquires the detection signal based on a magnetic signal generated in a magnetic body receiving the alternating magnetic field generated from the alternating magnetic field generating unit.

6. The object detecting apparatus according to claim 1, wherein, when the object to be detected and another object different from the object to be detected receive the alternating magnetic field together, the amplitude correction unit corrects the amplitude of the reference disturbance source detection signal read out of the disturbance source detection signal storage unit, so as to correspond to an amplitude of a component of the another object in the detection signal acquired by the detection signal acquiring unit.

7. The object detecting apparatus according to claim 6, further comprising:

an object component suppression unit that suppresses a component of the object to be detected in the detection signal acquired by the detection signal acquiring unit when the object to be detected and the another object different from the object to be detected receive the alternating magnetic field together, wherein the amplitude correction unit corrects the amplitude of the reference disturbance source detection signal so as to correspond to an amplitude of the detection signal in which the component of the object to be detected is suppressed by the object component suppression unit.

8. The object detecting apparatus according to claim 3, wherein the phase correction unit corrects the phase of the reference disturbance source detection signal, so as to correspond to a phase of a component of the another object in the detection signal acquired by the detection signal acquiring unit when the object to be detected and the another object different from the detecting object receive the alternating magnetic field together.

9. The object detecting apparatus according to claim 3, wherein the phase correction unit transfers the phase of the reference disturbance source detection signal by a predetermined amount, to generate a plurality of phase-corrected disturbance source detection signals, and the disturbance component suppression unit executes processing based on the plurality of phase-corrected disturbance source detection signals.

10. The object detecting apparatus according to claim 9, wherein the phase correction unit transfers the phase of the reference disturbance source detection signal gradually by a predetermined amount, to generate a plurality of phase-corrected disturbance source detection signals having different phases, and delivers the plurality of corrected disturbance source detection signals to the disturbance component suppression unit, when an object receives the alternating magnetic field, the disturbance component suppression unit generates a plurality of determination signals based on the detection signal acquired by the detection signal acquiring unit and each of the plurality of phase-corrected disturbance source detection signals, and delivers the plurality of determination signals to the detecting object determination unit, and the object determination unit determines whether or not the object receiving the alternating magnetic field is the object to be detected based on the plurality of determination signals, respectively, and when it is determined that the object is the object to be detected by any of the determination signals, the object determination unit decides that the object receiving the alternating magnetic field is the object to be detected.

11. The object detecting apparatus according to claim 9, wherein the phase correction unit transfers the phase of the reference disturbance source detection signal gradually by a predetermined amount, to generate a plurality of phase-corrected disturbance source detection signals having different phases, and when an object receives the alternating magnetic field, the phase correction unit executes processing of difference between each of the plurality of phase-corrected disturbance source detection signals and the detection signal acquired by the detection signal acquiring unit, the phase correction unit selects a phase-corrected disturbance source detection signal from the plurality of phase-corrected disturbance source detection signals, the selected phase-corrected disturbance source detection signal having a result of the processing of difference less than a predetermined threshold value, and the phase correction unit delivers the selected phase-corrected, disturbance source detection signal to the disturbance component suppression processing unit.

12. The object detecting apparatus according to claim 1, wherein the disturbance source detection signal storage unit stores one detection signal acquired by the detection signal acquiring unit, the stored one detection signal having been acquired by exposing a disturbance source that is preassigned as a reference and that is in a predetermined location to the alternating magnetic field, wherein the disturbance source includes a magnetic body that generates a disturbance component with respect to the detection signal including the signal indicative of the object.

13. The object detecting apparatus according to claim 1, further comprising an alternating magnetic field component suppression unit that suppresses a component of the alternating magnetic field from the reference disturbance source detection signal acquired by the detection signal acquiring unit, wherein the disturbance source detection signal storage unit stores a detection signal of the disturbance source in which the component of the alternating magnetic field is suppressed by the alternating magnetic field component suppression unit.

* * * * *